United States Patent [19]

Church

[11] Patent Number: 4,670,732

[45] Date of Patent: Jun. 2, 1987

[54] ELECTRICAL LAPPING GUIDE RESISTOR

[75] Inventor: Mark A. Church, Los Gatos, Calif.

[73] Assignee: International Business Machines, Armonk, N.Y.

[21] Appl. No.: 766,156

[22] Filed: Aug. 15, 1985

[51] Int. Cl.$^4$ .......................................... H01L 43/00
[52] U.S. Cl. ................................. 338/32 R; 360/110
[58] Field of Search ............. 338/9, 138, 32 R, 32 H; 360/110, 119, 122, 112; 29/603

[56] References Cited

U.S. PATENT DOCUMENTS

| | | | |
|---|---|---|---|
| 3,787,638 | 4/1972 | Murai | 179/100.2 |
| 3,821,815 | 10/1972 | Abbott et al. | 360/110 |
| 4,155,106 | 12/1982 | Muraoka et al. | 360/112 |

OTHER PUBLICATIONS

IBM Tech. Discl. Bull., vol. 11, No. 12, May 1969, p. 1792, entitled "Alignment of Read-Write Heads in Sliders".

*Primary Examiner*—E. A. Goldberg
*Assistant Examiner*—Marvin M. Lateef
*Attorney, Agent, or Firm*—Otto Schmid, Jr.

[57] ABSTRACT

An electrical lapping guide resistor for measuring the lapping distance in a process for manufacturing thin film magnetic transducers. Final throat height is measured with an electrical lapping guide resistor which provides a linear change in resistance versus lapping distance. The lapping guide resistor is configured in a shape such that the effective length of the resistors increases as the effective width decreases. In a preferred embodiment of the invention, the resistor includes first and second converging edges which extend from a rearward edge parallel to the final throat height toward the lapping surface. Conductors are disposed along the converging edges. Measurements of the change in lapping distance are effected by measuring the distance between the conductors.

10 Claims, 7 Drawing Figures

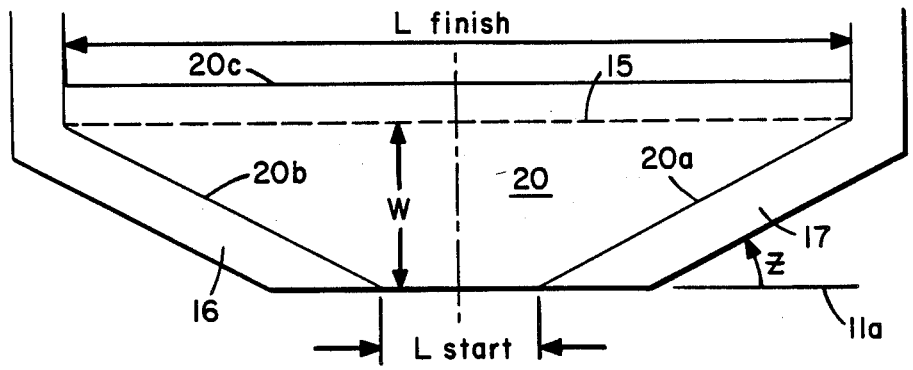
FIG. 3
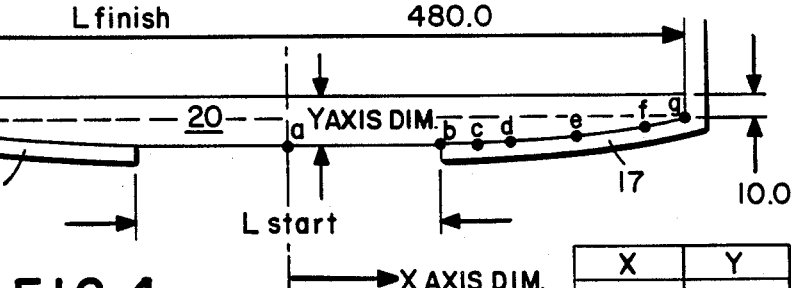
FIG. 4
| | X | Y |
|---|---|---|
| a | 0.00 | 20.00 |
| b | 140.00 | 20.00 |
| c | 154.00 | 19.50 |
| d | 170.25 | 18.75 |
| e | 200.00 | 17.00 |
| f | 230.50 | 14.00 |
| g | 240.00 | 10.00 |
FIG. 4a
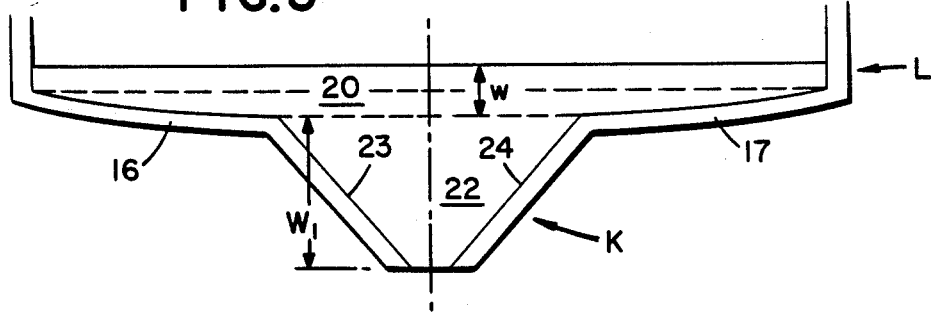
FIG. 5

ELECTRICAL LAPPING GUIDE RESISTOR

The present invention relates to the manufacture of thin film magnetic transducers. Specifically, an electrical lapping guide is described which permits an accurate measurement of the throat height obtained from lapping the transducing gap to a final dimension.

Thin film transducers provide for high density data recording on a magnetic disk carrier. Thin film transducers are batch fabricated by depositing a plurality of thin film transducing elements on a substrate, which are commonly aligned with parallel pole pieces. The entire substrate is lapped along a plane substantially parallel with the pole tip ends of the transducers. The transducing efficiency in large measure is determined by the length of the transducing gap, referred to as its final throat height. Accurate control over the length of this transducing gap provides optimum transducing efficiency.

The prior art has utilized electrical lapping guide structures to measure the distance lapped to control the final throat height. These structures typically embody first and second resistance elements called lapping guide resistors having an edge parallel to the lapping surface, disposed on opposite ends of the substrate. During fine lapping of the substrate, the resistor edge supporting the pole tips is lapped, yielding a resistance change which is proportional to the distance lapped. The position of the lapped edge with respect to final throat height is monitored by measuring the resistance of each of the resistance elements.

During the initial stages of lapping, the rough lap, the electrical lapping guide provides a coarse indication of lapping by producing a distinct and detectable resistance step change. The step change is effected by placing in parallel with the lapping guide resistor an electrical element which is broken by the lapping at a known distance from the final lapping plane. Such lapping guide structures are exemplified in U.S. Pat. No. 3,821,815. These prior art lapping structures which utilize a resistor for measuring the final lapping distance to a final throat height are rectangular in shape, and provide a non-linear resistance change as a function of the lapped distance. These non-linear measurements impose a limitation on obtaining very accurate throat height tolerances. During coarse lapping, the resistance vs lapping distance slope is so steep as to make lapping distance measurements very uncertain. During the final lapping stages, the resistance element provides a very flat resistance versus lapping distance characteristic, making a final measurement of throat height imprecise. Thus, these resistance elements find use only over a small lapping range.

SUMMARY OF THE INVENTION

It is an object of this invention to provide a method for accurately measuring the lapping distance in the manufacture of batch fabricated thin film magnetic heads.

It is a more specific object of this invention to provide an electrical lapping guide resistor having a resistance which changes linearly over the lapped distance.

These and other objects are accomplished by a lapping guide resistor in accordance with the invention. An electrical lapping guide resistor is provided which produces a substantially linear change in resistance as a function of the lapping distance. The resistor is deposited on two opposite sides of the transducer array. During lapping of the transducer array substrate, the resistance of the lapping guide resistor changes indicating the position of the lapped edge. The monitored resistance changes provide an accurate measurement of the throat height of the transducer array.

In a preferred embodiment of the invention, resistors of chromium material are deposited on each end of the transducer array. The resistors are configured in a shape such that the effective length of the resistors increases as the effective width decreases during lapping. As such, the resistance change is approximately linear, enhancing the resolution of controlling lapping distance, and expanding the lapping distance over which resistance measurements are useable. The preferred embodiment of the invention includes a pair of separated conductors which lie along first and second converging front edges of the deposited chromium resistance material forming along with the conductors a lapping guide resistor. The front edges of the resistor converge toward the edge of the substrate surface to be lapped. A third rearward edge of the resistor is parallel to the surface to be lapped. Preferably, the slope of the resistor's first and second converging edges decreases in the rearward direction, further linearizing the resistance change versus lapped distance. As the lapping commences, the resistor is also lapped, providing a resistance change measured between the conductors proportional to the lapped distance. The unique slope of the resistor edges provide for a linear resistance change as lapping progresses.

In another embodiment of the invention, the electrical lapping guide resistor comprises a first coarse lap resistance section abutting a second fine lap resistance section. The coarse lap resistance section includes a wider base edge continuous with the forward edge of the fine lap resistance section, and two additional edges which converge towards the lapping surface. The coarse lapping resistor will provide during early stages of lapping a resistance versus lapping distance slope of less than 0.1 ohm/micron. During a final lapping stage, the fine lap resistance section will provide a resistance change of approximately 25 ohms/micron.

DESCRIPTION OF THE FIGURES

FIG. 3 is an illustration of one embodiment of the invention having a geometry which effectively linearizes the change in resistance versus lapping distance.

FIG. 4 is an illustration of a preferred embodiment of the invention which further linearizes resistance versus lapping distance measurements.

FIG. 4A is a chart showing horizontal and vertical lapping distances according to the embodiment of FIG. 4.

FIG. 5 is an illustration of another embodiment of the invention which provides for a rough lapping distance measurement as well as a fine lapping distance measurement.

DESCRIPTION OF THE PREFERRED EMBODIMENTS

Figure 1:
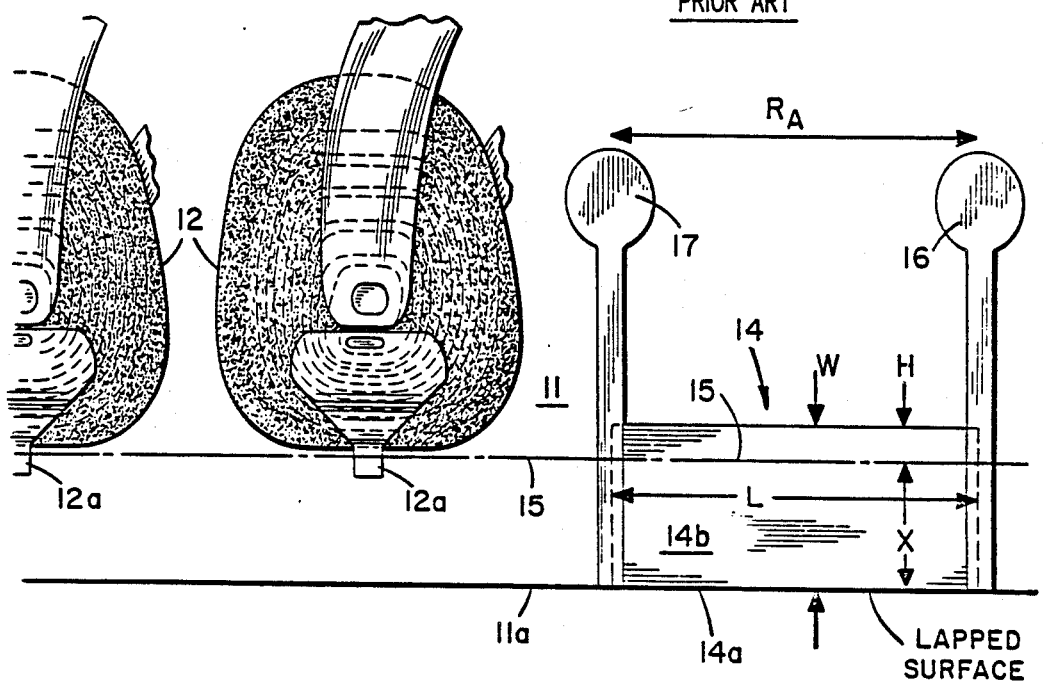
FIG. 1 is an illustration of a conventional electrical lapping guide resistor on one side of an array of thin film transducers.

Referring now to FIG. 1, there is shown an end of a substrate 11 having a plurality of deposited thin film transducers 12. An electrical lapping guide resistor 14 is shown having a front edge 14a parallel to a lapped surface 11a of the substrate, and parallel to a final throat height 15 of the pole pieces 12a of the transducer 12. The electrical lapping guide resistor 14 comprises a strap 14b of a metallic material, preferably chromium, deposited on the substrate and bounded by two conductors 16 and 17. The ratio of the resistance of the chromium strap to the conductors is 2:1. A similar lapping guide resistor is deposited on the opposite end of the substrate 11.

During lapping of the substrate 11 to accomplish a final throat height of the transducer 12, a rough lapping to approximately 10 μm is accomplished by optically monitoring the position of the lapped edge. At the conclusion of the rough lapping stage, the ends of the substrate bearing the lapping resistors are level to within 5 μm with respect to final throat height. From 10 μμm to final throat height, the resistance of each strap resistor 14b is used to monitor any leveling error. The detected leveling error is utilized to balance the lapping force on each end of the substrate. The final lapping distance from 10 μm to the final throat height is completed by monitoring the position of the lapped edge using the resistance measurements of the two electrical lapping guides 14.

Figure 2:
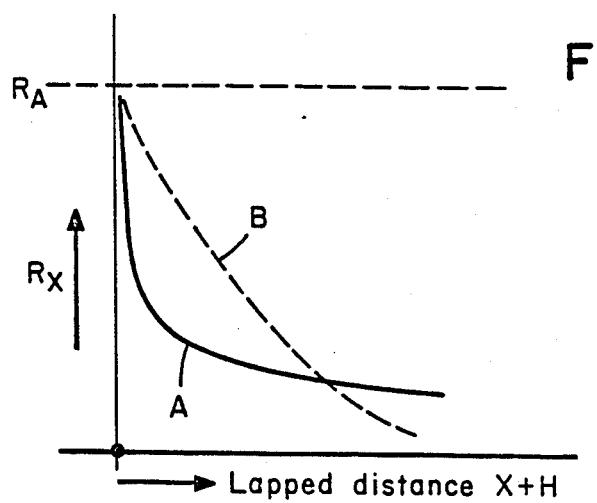
FIG. 2 illustrates the measured resistance versus lapping distance of a conventional electrical lapping guide resistor (a) and that of a preferred embodiment of the invention (b).

The prior art electrical lapping guides 14 of FIG. 1 have a non-linear response curve as shown by the solid line curve of FIG. 2. This curve is substantially proportional to $$Rx = Rs \cdot \left( \frac{L}{X + H} \right) + Rc,$$

Rx is the two point resistance measurement between the conductors 16 and 17;

Rs is the sheet resistance of the chromium strap 14b;

Rc is the contact and lead resistance of connections to conductors 16 and 17;

L is the effective length of the chromium strap 14b;

X is the lapping distance or width from the front edge 14a of the strap 14b to the final throat height; and H is the final width of the lapping resistor at final throat height.

The resistance vs lapping distance characteristic for the prior art electrical lapping guide resistor limits the usable response to a fine lapping distance of 10 μm. As is evident from FIG. 2, during rough lapping of the substrate the response curve A for the first 6 μm of lapping, shown by the solid line, is too sensitive to yield an ideal lapping measurement. At the low end of the response curve, the change in resistance is small as the lapping distance X decreases, yielding a poor signal to noise ratio. As the lapping distance approaches zero, the change in resistance becomes very large with a small removal of material during lapping. Thus, the dynamic range of the lapping guide resistor is limited to approximately the knee of the curve A since over this area a decrease in lapped distance gives a reasonable change in resistance RX. The curve B in dashed lines of FIG. 2 shows a resistance RX versus lapped distance according to the present invention.

To linearize the resistance of the electrical lapping guide, the resistor configuration of FIG. 3 may be employed. The resistor comprises a layer of chromium 20 as a strap. The resistor has a rear edge 20c parallel to the final throat height 15. The side edges 20a, 20b of the resistor 20 converge towards the lapped surface 11a at an angle to the lapped surface 11a. The final length, L finish, of the resistor at the throat height 15 can be approximately 480 μm. The beginning length, L start, is 20 μm. The electrical lapping guide of FIG. 3 provides for an effective increase in length of the resistor 20 as lapping progresses, thus linearizing the resistance versus lapping distance as shown in curve B of FIG. 2. Additional linearization of the resistance versus lapping distance is obtained by sloping resistor edges 20a, 20b and conductors 16 and 17, as shown in FIG. 4, such that the slope of the resistor edges 20a, 20b and conductors 16 and 17 in the earlier stage of lapping is slightly higher than the slope of the remaining portion. It was further observed that improved resolution can be obtained during rough lapping by increasing the spacing between conductors 16 and 17. The x/y coordinates in microns for the edges shown in FIG. 4 are shown in the FIG. 4a. The X coordinates are the distance from the central line to the conductor 17. The Y coordinates are the width of the strap 20.

Figure 6:
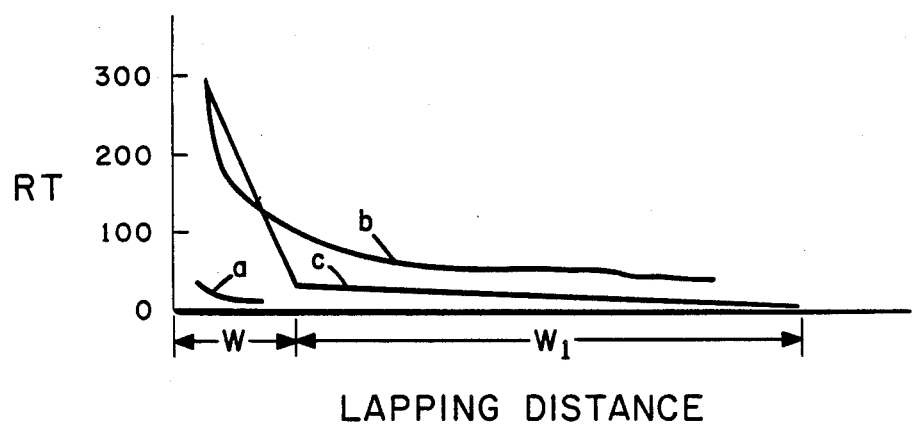
FIG. 6 is an illustration of the resistance versus lapping distance characteristic for the embodiment of FIG. 5.

To achieve an even higher range of lapping for the resistors which will cover both rough and final lapping, the embodiment of FIG. 5 is shown. An extension portion 22 was added to the resistor 20 of FIG. 4. The extension portion 22 comprises a coarse lapping resistance section K having a base portion in contact with the forward edge of the fine lapping resistance section L. The extension portion 22 which begins at the fine lap dimension W, equal to 10 μm, extends approximately the distance W1, of 70 μm to a coarse lap beginning edge along two converging edges 23, 24. The resistance change during a coarse lap is from approximately 4 to 15 ohms. The fine lap resistance change is approximately 25 to 275 ohms for a resolution of about 25 ohms/1 μm. The performance of the embodiment of FIG. 5 compared with the conventional lapping resistor of FIG. 1 for a 50:1 strap to conductor sheet resistance ratio is shown in FIG. 6. The resolution during coarse lap, noise immunity and improved linearization during fine lap is evident from curve (c) of the Figure. Conventional lapping resistors exhibit the characteristics (a) and (b) also shown in FIG. 6. In curve (c), the resistance changes slowly but measurably during the rough lap, i.e., lapping distance W1. Then the resistance change increases a large amount over the lapping distance W, which is the width of the strap resistor 20. Better control is required and obtained for the fine lap portion since the resistance RX is more directly representative of the lapping distance W and therefore of the final throat height.

Thus, it is seen that by advantageously contouring the edges of a lapping resistor, the effective change of lapping distance versus resistance may be controlled. Tapering of the respective resistor edges will provide for a resistance change which is more linear and provides a higher noise immunity than conventional lapping structures.

While the invention has been particularly shown and described with reference to preferred embodiments thereof, it will be understood by those skilled in the art that various changes may be made without departing from the spirit and scope of the invention.

What is claimed is:

1. An electrical lapping guide resistor which provides a linear resistance change in response to a position change of a lapped edge comprising:

first and second converging conductors defining first and second edges of said resistor, said conductors separated from each other at a front edge of a surface to be lapped, and extending rearwardly from said front edge at an angle thereto to first and second resistance measurement connection points; and resistance material deposited along the inner surface of said conductors, and rearward of said front edge, said resistance material defining a rearward edge of said resistor parallel to said front edge and terminating at said conductors, whereby lapping along said front edge reduces the effective width of said resistor while the effective length of said resistor increases for producing a linear change in the resistance measured between said connection points.

2. The electrical lapping guide resistor of claim 1 wherein said first and second conductors extend rearward for a major portion of their length at a first slope and over a remaining portion thereof are perpendicular to said rearward edge.

3. The electrical lapping guide resistor of claim 1 wherein the ratio of the resistance of said resistance material to said conductor is substantially 2 to 1.

4. An electrical lapping guide resistor which provides a linear change in resistance in response to a lapped edge of a substrate comprising:

a resistive deposit having a rearward edge parallel to said lapped edge, and second and third edges diverging at an acute angle from said lapped edge to said rearward edge;

first and second conductors disposed along said second and third edges, said conductors having first adjacent ends spaced apart at said lapped edge, and having remaining ends adjacent said rearward edge adapted to receive resistance measuring connections;

whereby lapping of said substrate lapped edge reduces said resistive deposit width in proportion to the effective length of said resistive deposit producing a change in resistance proportional to the distance lapped.

5. The electrical lapping guide resistor of claim 4 wherein said resistive deposit includes third and fourth edges perpendicular to said rearward edge, connecting said rearward edge to said second and third edges.

6. The electrical lapping guide resistor of claim 4 wherein said second and third edges of said resistive deposit have a steeper slope with respect to said rearward edge in the region adjacent said lapped edge than in the region adjacent said rearward edge.

7. The electrical lapping guide resistor of claim 4, wherein the slope of said second and third edges decreases from a maximum at one end thereof to a minimum near said rearward edge.

8. An electrical lapping guide resistor for providing a rough and fine substrate lapping distance indication comprising:

a fine lapping resistance section having a width which symmetrically tapers along a front edge thereof from a maximum width along the center of said section towards a minimum width at each end of said section;

a coarse lapping resistance having a base section adjacent said fine lapping resistance section front edge and side edges converging from said base section towards a surface parallel with a surface to be lapped; and first and second conductor members in contact with said coarse lapping surface converging edges, and said fine lapping surface front edge along a portion outside of said base section, said conductor members extending rearward of said fine lapping resistance section and terminating at resistance measurement contact means.

9. The electrical lapping guide resistor of claim 8, wherein the slope of said front edge in the fine lapping section gradually changes.

10. The electrical lapping guide resistor of claim 9 wherein said slope of said front edges gradually decreases in the direction of a rearward edge of said fine lapping resistance section.

* * * * *